United States Patent [19]
Dorri et al.

[11] Patent Number: 5,439,543
[45] Date of Patent: Aug. 8, 1995

[54] APPARATUS AND METHOD FOR PASSIVE SHIMMING OF A SUPERCONDUCTING MAGNET WHICH IMAGES HUMAN LIMBS

[75] Inventors: Bizhan Dorri, Clifton Park; Evangelos T. Laskaris; Kenneth G. Herd, both of Schenectady; Raymond E. Gabis, Scotia, all of N.Y.

[73] Assignee: General Electric Company, Schenectady, N.Y.

[21] Appl. No.: 183,375

[22] Filed: Jan. 19, 1994

Related U.S. Application Data

[62] Division of Ser. No. 346, Jan. 4, 1993, Pat. No. 5,317,298.

[51] Int. Cl.$^6$ ............................................. B65H 81/00
[52] U.S. Cl. ..................... 156/184; 156/191; 156/153; 335/299
[58] Field of Search ............... 156/184, 185, 187, 191, 156/169, 172, 153; 335/298, 299, 301

[56] References Cited

U.S. PATENT DOCUMENTS

| | | | |
|---|---|---|---|
| 4,698,611 | 10/1987 | Vermilyea | 335/298 |
| 4,733,189 | 3/1988 | Punchard et al. | 324/318 |
| 4,743,880 | 5/1988 | Breneman et al. | 335/301 |
| 4,771,243 | 9/1988 | Vreugdenhil et al. | 324/320 |
| 4,771,244 | 9/1988 | Vermilyea | 324/320 |
| 4,803,433 | 2/1989 | McBride | 324/318 |
| 4,935,714 | 6/1990 | Vermilyea | 335/299 |
| 5,003,266 | 3/1991 | Palkovich et al. | 324/320 |
| 5,047,720 | 9/1991 | Guy | 324/320 |

Primary Examiner—James J. Engel
Attorney, Agent, or Firm—Douglas E. Erickson; Paul R. Webb, II

[57] ABSTRACT

This invention relates to an apparatus and method for providing passive shimming for a superconducting magnet of the type that has a relatively small imaging volume. Such structures of this type, generally, provide the proper amount of passive shimming for a relatively small imaging volume.

4 Claims, 5 Drawing Sheets

APPARATUS AND METHOD FOR PASSIVE SHIMMING OF A SUPERCONDUCTING MAGNET WHICH IMAGES HUMAN LIMBS

This application is a division, of application Ser. No. 08/000,346, filed Jan. 4, 1993, now U.S. Pat. No. 5,317,298.

BACKGROUND OF THE INVENTION

1. Field of the Invention

This invention relates to an apparatus and method for providing passive shimming for a superconducting magnet of the type that has a relatively small imaging volume. Such structures of this type, generally, provide the proper amount of passive shimming for a relatively small imaging volume.

2. Description of the Related Art

In magnetic resonance (MR) imaging systems, the magnetic field inhomogeneities have to be less than a few parts per million (ppm) for producing good images. Therefore, a superconducting magnet is designed for a homogeneous field distribution of only a few (ppm) within the imaging volume. However, once built, due to the manufacturing tolerances, lead routings, and other manufacturing difficulties, the ppm inhomogeneities are usually in the range of hundreds. Active or passive shimming needs to be used to homogenize the magnetic field.

In recent years, due to its lower cost, simplicity, and capabilities, passive shimming has been the preferred method of field inhomogeneity correction. Exemplary of such passive shimming systems are U.S. Pat. Nos. 4,698,611 and 4,771,244 entitled "Passive Shimming Assembly for MR Magnet" and "Method for Passively Shimming Magnetic Resonance Magnet", respectively, both to M. E. Vermilyea and both assigned to the same assignee as the present invention. While these prior passive shimming assemblies have met with a modicum of success, due to the compact nature of an imaging system which images only the limbs, the space available for passive shimming is extremely limited. In order to keep the length of the MR system down and the inside diameter of the MR system large, the magnet coils and the gradient coil need to be physically very close. This is in fact the area where passive shims need to be placed. Therefore, a passive shimming systems needs to be designed which will occupy the least amount of physical space.

It is apparent from the above that there exists a need in the art for a passive shim/gradient coil assembly which is light weight and compact through simplicity of parts and uniqueness of structure, and which at least equals the shimming and gradient coil characteristics of known shimming and gradient coil systems, but which at the same time is capable of providing passive shimming and a gradient coil for a relatively small imaging volume. It is a purpose of this invention to fulfill this and other needs in the art in a manner more apparent to the skilled artisan once given the following disclosure.

SUMMARY OF THE INVENTION

Generally speaking, this invention fulfills these needs by providing an integral passive shim/gradient coil assembly, comprising a gradient coil means, a passive shim support means integrally attached to said gradient coil means, shim locations located substantially adjacent to said shim support means, a passive shim means placed within a predetermined number of shim locations, a shim cover means operatively connected to said passive shim means, and a holding means for holding said shim cover means in place over said passive shim means.

In certain preferred embodiments, the gradient coil assembly includes a cylinder stacked with X, Y and Z gradient finger-print coils. Over this assembly, about 0.070 inch of fiberglass is wound and the whole cylinder is epoxy impregnated. Also, the shim locations are formed by 25 circumferential grooves and 12 axial grooves which create a total of 300 shim locations. Finally, the shim covers are constructed of brass.

In another preferred embodiment, a compact, passive shim/gradient coil system is developed for use in a superconducting magnet which has a relatively small imaging volume.

The preferred passive shim/gradient coil assembly, according to this invention, offers the following advantages: lightness in weight; excellent shimming characteristics; excellent gradient coil characteristics; reduced size; good stability; good durability; good economy; and high strength for safety. In fact, in many of the preferred embodiments, these factors of lightness in weight, excellent shimming characteristics, excellent gradient coil characteristics; and reduced size are optimized to an extent that is considerably higher than heretofore achieved in prior, known passive shim or gradient coil assemblies.

BRIEF DESCRIPTION OF THE DRAWINGS

The above and other features of the present invention which will be more apparent as the description proceeds are best understood by considering the following detailed description in conjunction with the accompanying drawings wherein like character represent like parts throughout the several veins and in which.

DETAILED DESCRIPTION OF THE INVENTION

Figure 1:
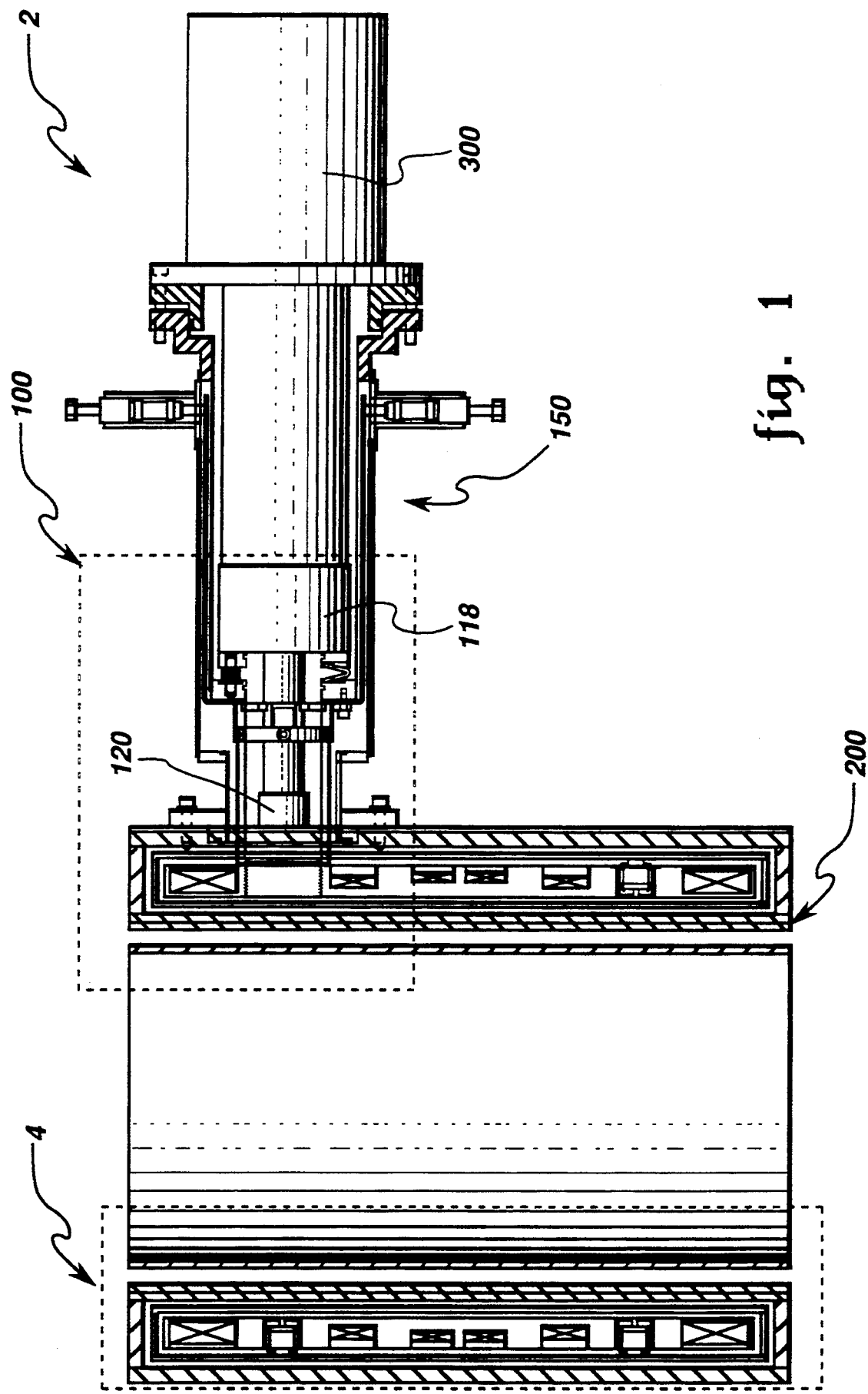
FIG. 1 is a top plan view of an eddy-current free, superconducting imaging magnet for human limbs, according to the present invention.

With reference first to FIG. 1, there is illustrated eddy-current free, superconducting imaging magnet 2 for imaging human limbs. Magnet 2 includes, in part, magnet cartridge 4, High-Tc superconducting lead and magnet support assembly 100, thermal stations 118, 120, cold head sleeve assembly 150, and gradient coil/passive shimming assembly 200.

Figure 2:
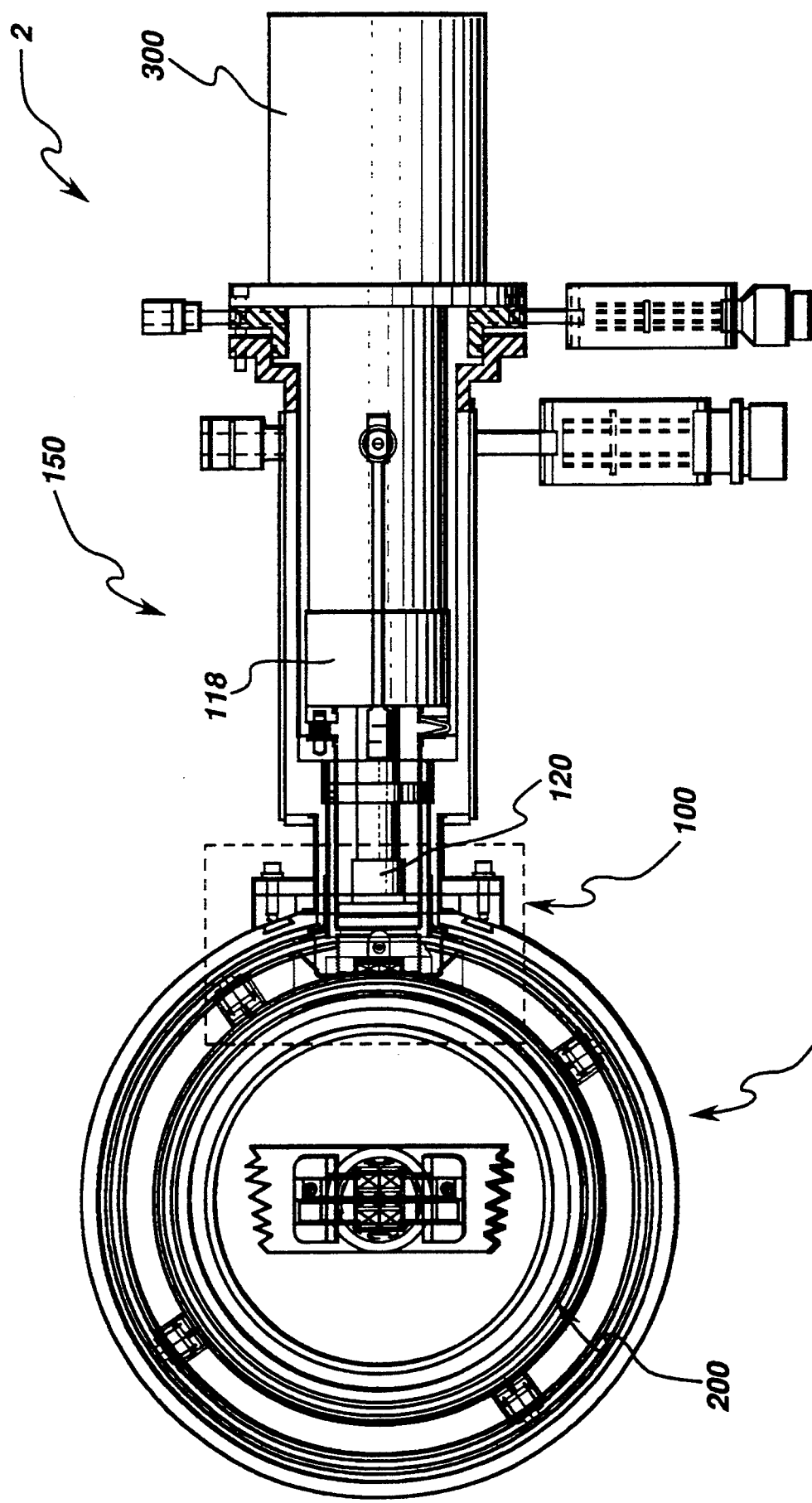
FIG. 2 is a side plan view of the eddy-current free, superconducting imaging magnet for imaging human limbs, according to the present invention.

FIG. 2 is an end view illustration of FIG. 1 in which magnet cartridge 4, High-Tc superconducting lead and magnet support assembly 100, cold head sleeve assembly 150 and gradient coil/passive shim assembly 200 are also illustrated.

Figure 3:
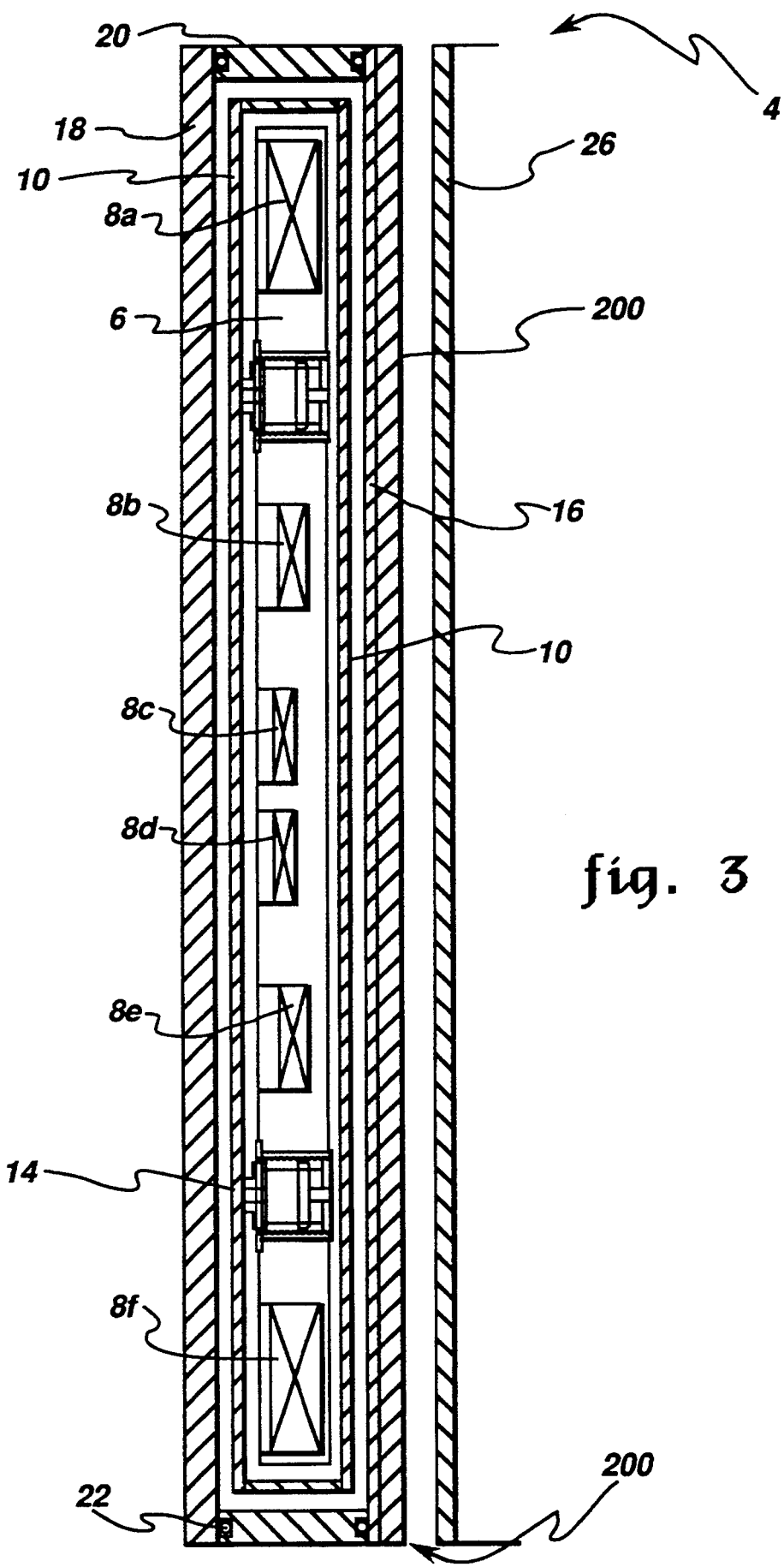
FIG. 3 is an expanded view of the mechanical support and thermal shield assembly for the eddy-current free, superconducting imaging magnet for imaging human limbs.

FIG. 3 is a detailed illustration of magnet cartridge assembly 4 as more generally shown in FIGS. 1 and 2. Magnet cartridge assembly 4 includes, in part, magnet cartridge 6, superconducting coils 8a–8f, thermal shield 10, shield supports 14, inner bore tube 16, vacuum enclosure 18, end plates 20, conventional elastomeric O-rings 22, RF coil 26, and gradient coil/shimming assembly 200. In particular, cartridge 6, preferably, is constructed of any suitable epoxy reinforced fiberglass with copper wires (not shown) for axial thermal conduction. Coil 8a–8f are constructed of any suitable superconducting coil material. Thermal shield 10, preferably, is constructed of any suitable epoxy reinforced fiberglass material and copper wire. Bore tube 16, enclosure 18 and plates 20, preferably, are constructed of any suitable epoxy reinforced material with stainless steel. Supports 14 are used such to rigidly attach thermal shield 10 to cartridge 6 such that heat transference from shield 10 to cartridge 6 can be minimized as magnet 2 is operating.

Figure 4:
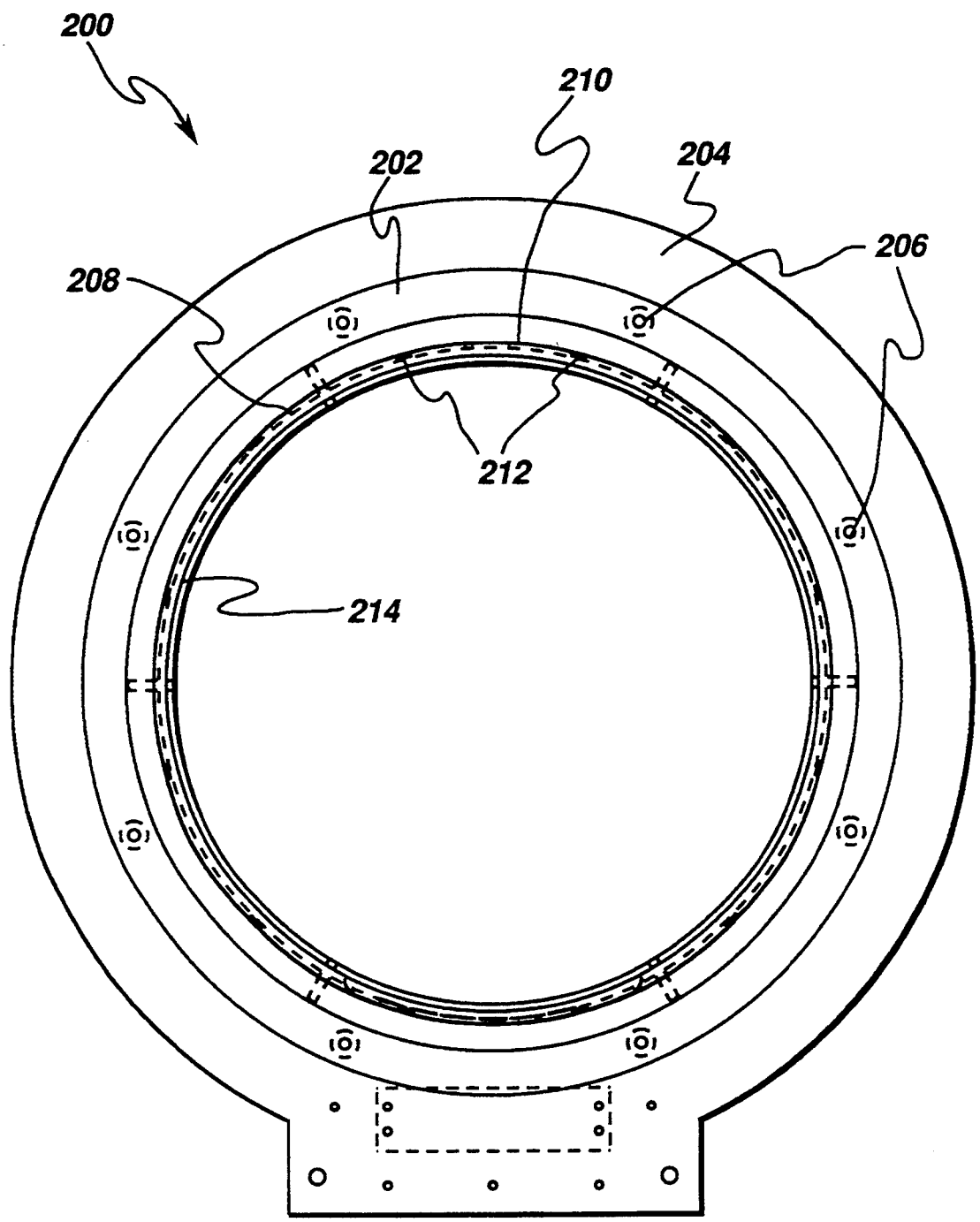
FIG. 4 is an end view of the passive shim/gradient coil form assembly for the eddy-current free, superconducting imaging magnet for imaging human limbs, according to the present invention.

FIG. 4 illustrates an end view of passive shim/gradient coil assembly 200. Assembly 200 includes, in part, end ring 202, support plate 204, shimming assembly 210, axial grooves 212 and gradient coil assembly 214. In particular, ring 202, preferably, is constructed of aluminum and is rigidly attached to support 204 by conventional fasteners 206. Support 204, preferably, is constructed of any suitable epoxy-reinforced fiber glass material. Ring 202 is rigidly attached to support 204 in order to slide passive shim/gradient coil assembly 200 in and out of magnet 2. After the magnet 2 is fully shimmed, ring 202 is removed. Grooves 212 are machined by conventional machining techniques. Gradient coil 214 includes conventional X, Y, Z gradient fingerprint coils over which the passive shimming assembly 210 is assembled.

Figure 5:
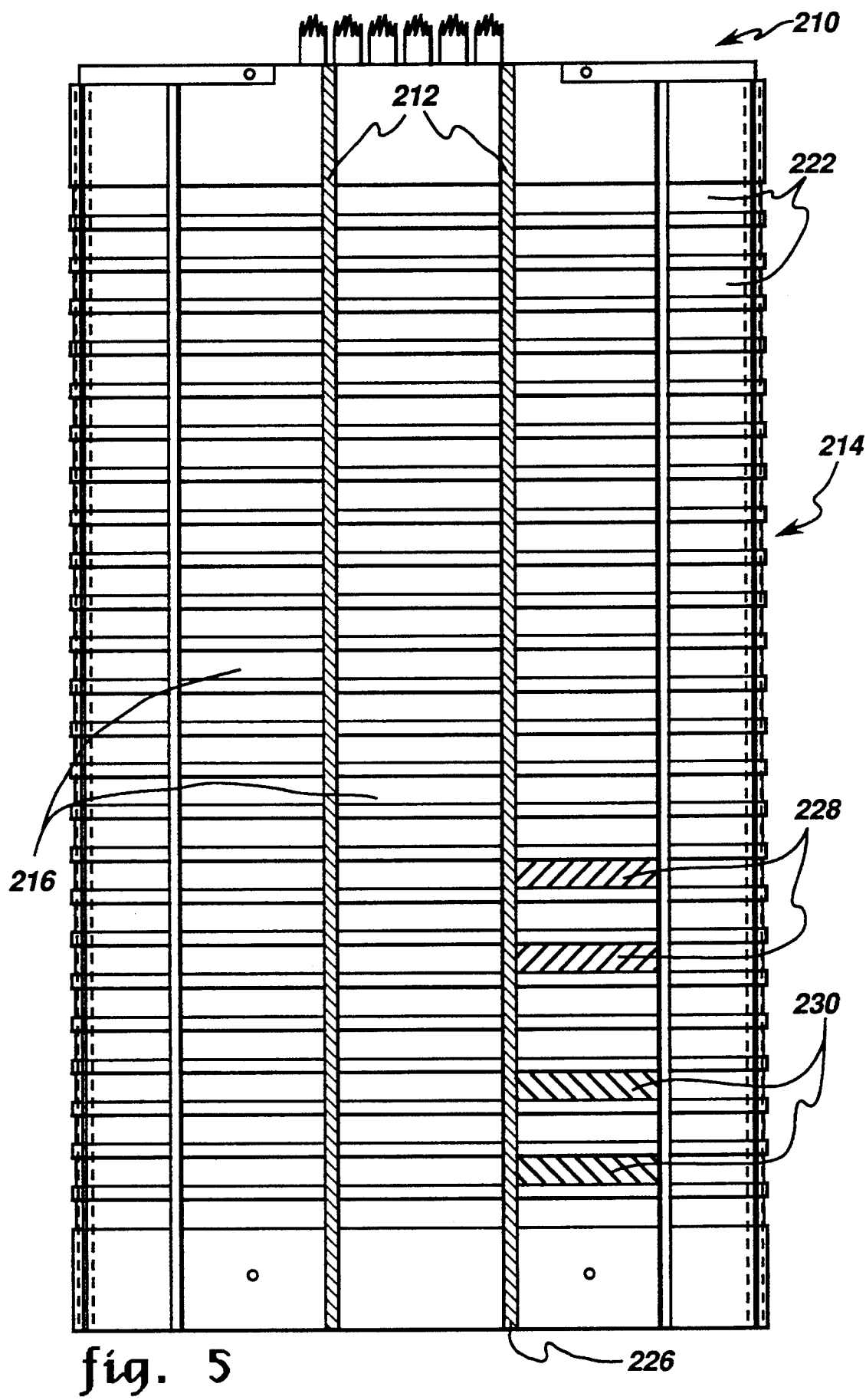
FIG. 5 illustrates a top view passive shim/gradient coil form assembly of FIG. 4 with the ring disconnected.

With respect to FIG. 5, there is illustrated passive shim assembly 210. Shim assembly 210 includes, in part, grooves 212, 222, shimming locations 216, shims 228, and shim covers 230. In particular, shimming assembly 210 includes twelve axial grooves 212 and twenty-five circumferential grooves 222 which are machined into the outer diameter of gradient coil 214 by conventional machining techniques. Consequently, due to the number of grooves 212 and 222, there are 300 locations in which shims 228 can be located. Located in grooves 212 on the shimming assembly 210 are axial pieces 226. Pieces 226, preferably, are constructed of any suitable epoxy-reinforced fiberglass material. These pieces create pockets for passive shims 228 at the 300 location. Shims 228, preferably, are constructed of any suitable carbonaceous steel material. Shim covers 230, preferably, are constructed of brass.

The passive shims 228 are designed to be placed between the gradient coil 214 and the inner bore of magnet 2. It is calculated that 0.050 inch thick steel shims 228 is maximum thickness needed to homogenize the field errors of magnet 2. In order to comply with the least amount of space, passive shim hardware is combined with the gradient coil 214 to form assembly 200. In other words, once the gradient coil 214 is manufactured, allowances are made for the passive shim assembly 210 on the outer diameter of gradient coil 214. The assembly 200 includes a cylinder which is stacked with X, Y and Z gradient fingerprint coils 214 (FIG. 4). With this assembly, about 0.070 inch of fiber glass 208 is wound and the whole cylinder is then epoxy impregnated. For the magnet 2, the inner diameter of the assembly 200 is 9.056 inches and its outer diameter is 9.615 inches. The magnet's warm bore has an inner diameter of 9.625 inches. Twenty-five circumferential grooves 222 are machined by conventional machining techniques on the outer diameter of the gradient coil assembly 214. These grooves, preferably, are 0.051 inch deep and 0.39 inch wide. Twelve axial grooves 212 are also machined by conventional machining techniques on the outer diameter of gradient coil 214 and epoxy reinforced fiberglass pieces 226 are glued by a conventional adhesive in place. This will provide 300 shim locations which is equivalent to a conventional whole body magnetic resonance imaging system. Passive shims 228 are approximately 2.281 inches long, 0.375 inch wide and 0.001 to 0.003 inch thick and are placed within several predetermined locations. Passive shim covers 230 of similar width and length and a thickness of 0.005 inch are used to cover the shims 228. Adhesive tape such as Kapton ® are used to keep the shims 228 and shim covers 230 in place. The gradient coil/passive shim cylinder assembly 200 is fitted with a temporary aluminum ring 202. This ring, as discussed earlier, allows for shimming iterations, i.e., to pull the cylinder in and out for placing the shims and to push it back in.

With respect to the shim configuration, a previously patent and method, U.S. Pat. 5,045,794, entitled "Method of Optimizing Passive Shim Placement of Magnet Resonance Magnets", to Dorri et al. and assigned to the same assignee as the present invention can be used to determine the amount and location of the passive shims for which the PPM inhomogeneity is minimized.

Once given the above disclosure, many other features, modification or improvements will become apparent to the skilled artisan. Such features, modifications or improvements are, therefore, considered to be a part of this invention, the scope of which is to be determined by the following claims.

What is claimed is:

1. A method for forming an integral passive shim/gradient coil assembly including a gradient coil means, a fiberglass means, an epoxy means, a passive shim means, a shim cover means, and a holding means, wherein said method is comprised of the steps of:
    wrapping said fiberglass means around an outer diameter of said gradient coil means;
    impregnating said wrapped fiberglass means with said epoxy means;
    creating grooves in said impregnated fiberglass means;
    placing said passive shim means in at least some of said grooves;
    placing said shim cover means over said placed passive shim means; and
    retaining said placed shim cover means over said placed passive shim means by said holding means.

2. The method, as in claim 1, wherein said passive shim means is constructed of:
    carbon steel.

3. The method, as in claim 1, wherein said shim cover means is further comprised of:
    brass.

4. The method, as in claim 1, wherein said creating step is further comprised of:
    creating circumferential grooves.

* * * * *